US 9,103,880 B2

(12) United States Patent
Greene et al.

(10) Patent No.: US 9,103,880 B2
(45) Date of Patent: Aug. 11, 2015

(54) ON-CHIP PROBE CIRCUIT FOR DETECTING FAULTS IN AN FPGA

(71) Applicant: Microsemi SoC Corporation, San Jose, CA (US)

(72) Inventors: Jonathan W. Greene, Palo Alto, CA (US); Dirk Kannemacher, Neustadt am Ruebenberge (DE); Volker Hecht, Barshinghausen (DE); Theodore Speers, San Jose, CA (US)

(73) Assignee: Microsemi SoC Corporation, San Jose, CA (US)

( * ) Notice: Subject to any disclaimer, the term of this patent is extended or adjusted under 35 U.S.C. 154(b) by 223 days.

(21) Appl. No.: 13/933,353

(22) Filed: Jul. 2, 2013

(65) Prior Publication Data

US 2014/0006887 A1    Jan. 2, 2014

Related U.S. Application Data

(60) Provisional application No. 61/667,313, filed on Jul. 2, 2012.

(51) Int. Cl.
| G01R 31/3177 | (2006.01) |
| G01R 31/3185 | (2006.01) |
| G01R 31/317  | (2006.01) |

(52) U.S. Cl.
CPC ...... *G01R 31/3177* (2013.01); *G01R 31/31723* (2013.01); *G01R 31/318519* (2013.01)

(58) Field of Classification Search
CPC .................. G01R 31/3177; G01R 31/318519; G01R 31/31723
See application file for complete search history.

(56) References Cited

U.S. PATENT DOCUMENTS

| 5,012,180 | A  | 4/1991  | Dalrymple et al.    |
| 6,356,514 | B1 | 3/2002  | Wells et al.        |
| 7,155,651 | B2 | 12/2006 | Nadeau-Dostie et al.|
| 7,202,656 | B1 | 4/2007  | Gearhardt et al.    |
| 7,375,570 | B2 | 5/2008  | Gearhardt et al.    |
| 2004/0093544 | A1 | 5/2004 | Belzile et al.     |
| 2006/0041803 | A1 | 2/2006 | Woodward et al.    |
| 2006/0255833 | A1 | 11/2006 | Singh et al.      |

OTHER PUBLICATIONS

The International Bureau of WIPO, International Preliminary Report on Patentability issued in PCT/US2013/049029, Jan. 6, 2015, 7 pages.

(Continued)

*Primary Examiner* — Sam Rizk
(74) *Attorney, Agent, or Firm* — Leech Tishman Fuscaldo & Lampl; Kenneth D'Alessandro, Esq.

(57) ABSTRACT

An integrated programmable logic circuit having a read/write probe includes a plurality of programmable logic circuits having internal circuit nodes and a plurality of flip flops, each having an asynchronous data input line, an asynchronous load line, and a data output connected to an internal circuit node, a probe-data line, an address circuit for selecting one of the internal circuit nodes, a read-probe enable line for selectively coupling the selected one of the internal circuit nodes to the probe-data line, a data input path to the asynchronous data input line of each flip flop, a write-probe data input path to the asynchronous data input line of each flip flop, a write-probe enable line, and selection circuitry, responsive to the address circuit and the write-probe enable line, to couple one of the data input path and the write-probe data input path to the asynchronous data input of a selected flip flop.

19 Claims, 2 Drawing Sheets

(56) References Cited

OTHER PUBLICATIONS

Abramovici et al., "BIST-Based Delay-Fault Testing in FPGAs," Journal of Electronic Testing: Theory & Applications, 2003, pp. 549-558, vol. 19, No. 5.

Chmelar, "FPGA Interconnect Delay Fault Testing," Proc. Int'l Test Conf. (ITC 03), 2003, pp. 1239-1247.

Kobayashi, "AppNote 5202: PLL Control Circuit Example for FastScan/TestKompress," AppNotes, Jul. 2005, 16 pages.

Madge et al., "Obtaining High Defect Coverage for Frequency-Dependent Defects in Complex ASICs," IEEE Design & Test of Computers, Sep.-Oct. 2003, pp. 46-53.

ON-CHIP PROBE CIRCUIT FOR DETECTING FAULTS IN AN FPGA

BACKGROUND

1. Field of the Invention

The present invention relates to field-programmable-gate-array (FPGA) integrated circuit technology. More particularly, the present invention relates to on-chip circuits for testing an FPGA for the presence of defects.

2. Prior Art

Traditionally, integrated circuits are only tested for functional defects (those that become apparent no matter how slowly the chip is operated). However as semiconductor technology scales, it becomes necessary to check for other defects as well.

Methods for testing for delay defects in nonprogrammable integrated circuits, such as standard cell ASICs, are known in the prior art. Some of these are applicable also to programmable integrated circuits, including FPGAs. Other testing methods are specific to programmable integrated circuits.

There are three general categories of known test methods: at-speed functional test with the intended design; scan chain testing; and methods specific to programmable logic devices. Each is considered in turn.

In at-speed functional testing, the circuit is tested by running it as in normal operation, but using the highest specified clock frequency. This can be very effective for non-programmable integrated circuits (or for programmable integrated circuits that are already programmed with the intended design and will not be reprogrammed). However for programmable integrated circuits, the need to use the highest specified clock frequency is problematic, since this frequency is very design-dependent and end-user designs are not known at the time of testing.

Scan chains are a widely used technique for performing functional testing of non-programmable integrated circuits (e.g. standard cell ASICs). The various flip-flops in an integrated circuit are connected together to form a shift register (scan chain) independent of the normal functional logic. By putting the flip-flops in a special scan mode, test data can be shifted into and/or out of the flip-flops.

Scan chains can also be used to test for delay defects. There are two methods for using scan chains to perform delay-defect testing, launch from shift and launch from capture. One example is found in R. Madge, B. R. Benware and W. R Daasch, "Obtaining High Defect Coverage for Frequency-Dependent Defects in Complex ASICs, IEEE Design & Test of Computers," September-October 2003, pp. 46-53.

Common to both methods is that two clock pulses are applied at high speed and path delays exceeding the intervening time are detected. First, a test pattern is loaded using the scan chain. Signals are then launched through the delay paths either by a last pulse of the clock in scan mode ("launch from shift"), or by pulsing the clock in normal mode ("launch from capture"). After a suitable delay, the outputs of the delay paths are captured in the flip-flops by another pulse of the clock, in normal mode. In some cases it may be desirable to pulse the clock multiple times in normal mode before reading out the data.

An FPGA programmed with a particular design can also be tested for delay defects using launch and capture pulses if some means (analogous to a scan chain) is provided to control and observe the flip-flops. In an FPGA, alternatives for controlling and observing the flip-flops include a hard (built-in) scan chain, a soft (programmed as part of the design) scan chain, and a read/write probe circuit using row/column addressing. In the following discussion, the term "scan chain" will be considered to include any of these or other similar means for controlling and observing the flip-flops.

Some one-time programmable FPGAs Manufactured by Microsemi Corporation, formerly Actel Corporation, provide a probe circuit that provides random access to the flip-flops in the programmable fabric. The output of a probe circuit is made available on an external pin of the chip, providing real-time observation of a selected flip-flop output or other test point. The probe is intended to facilitate testing of the FPGA by its manufacturer and debugging of his design by the user. However this circuit is read-only, providing only observability, not controllability.

Non-programmable logic chips typically add scan chain circuitry to their flip-flops. Scan chains are a widely used technique for testing of such chips (e.g. standard cell ASICs). The various flip-flops in a chip are connected together to form a shift register (scan chain) independent of the normal functional logic. By putting the flip-flops in a special scan mode, test data can be shifted into and/or out of the flip-flops. By providing both observability and controllability, the scan chain allows fault coverage up to about 97%. This is much more than is possible if the only access was via the external pins of the chip, which justifies the additional area required to add scan chains.

In reprogrammable logic, such as SRAM- or flash-based FPGAs, testing is typically done by programming multiple test designs into the chip and applying test vectors to each design through the external pins. Because each design is specifically chosen for testing, it is not necessary to provide extra circuitry like scan chains to achieve good coverage. In fact coverage nearing 100% can be achieved. For this reason, scan chains have not previously been added to flip-flops in the programmable fabric of FPGAs.

For volume production it may sometimes be desirable to test FPGAs for use with a specific customer design. In this case, defects in circuitry not used by the particular design can be ignored. Even in this case however the testing is still generally performed by programming multiple test designs into the chip.

Flash-based FPGAs take significantly longer to program than SRAM-based FPGAs, and so can benefit from improved testing methods for volume production. It would be advantageous to be able to pre-program the FPGA only once with the specific customer design, and test it without need for further reprogramming (e.g. of multiple test designs). Some means of controlling and observing flip-flops is required. One possibility is to add explicit scan chains to the user's design and implement them in the programmable fabric (soft gates). However this consumes expensive logic capacity. Some equivalent of scan chain but better suited to FPGAs is required.

Some FPGAs are designed for low power applications. Here it is desirable to be able to save the system state information (e.g. data in flip-flops and RAM blocks) to non-volatile bulk storage before powering down the FPGA. Then when the FPGA is powered up again, the state can be restored from the non-volatile memory. The Lattice Semiconductor XP2 FPGAs provide this capability for RAM blocks, but not for flip-flops. Saving and restoring the flip-flop state also requires some means for observing and controlling the flip-flops.

BRIEF DESCRIPTION

An integrated circuit includes a read/write probe, using an asynchronous load capability of internal flip-flops, which provides random access to the flip-flops in the programmable fabric. The probe circuit may be used to allow real-time observation of a selected flip-flop output or other test point, to provide functionality equivalent to a scan chain, or to load/restore system state information to/from a non-volatile memory.

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons.

The present invention may be used to test an FPGA for the presence of delay defects. These are defects that become apparent only during high-speed operation. Such defects change (usually increase) the delay on signal paths, yet do not alter the functionality of the FPGA at lower-speed operation. It is desirable to perform the necessary testing as quickly as possible using a readily available and inexpensive tester (hardware external to the FPGA).

It is desirable to be able to test the FPGA in both of two different modes. First, it is desirable to be able to test unprogrammed FPGAs. Here the FPGA may be tested by configuring it to implement one or more specially-chosen test designs (the fewer the better). It is also desirable to be able to test pre-programmed FPGAs already configured to a specific end-user design. In this case the test must be performed using the end-user design since the FPGA cannot be further reconfigured.

Figure 1:
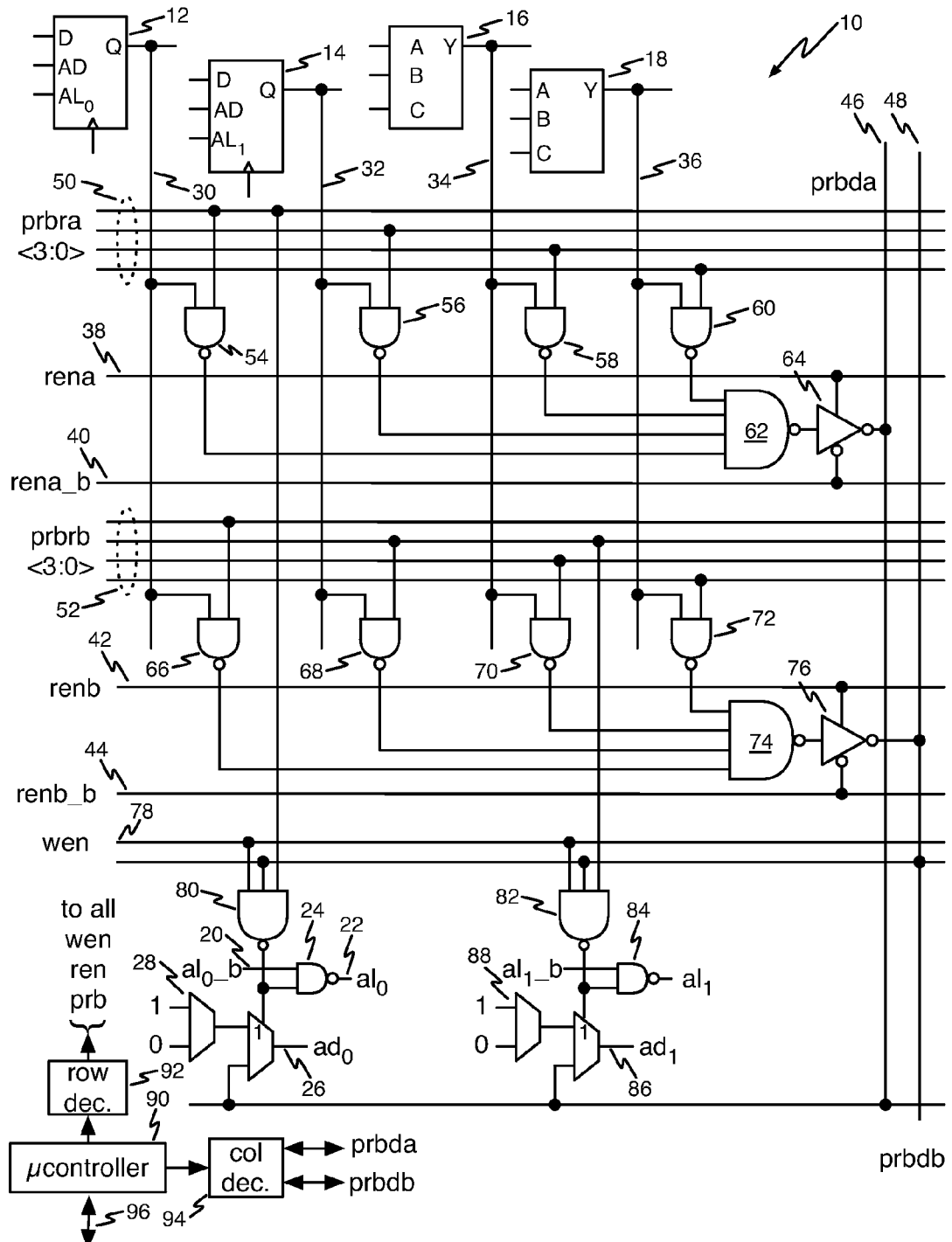
FIG. 1 is a diagram showing an illustrative probe read/write addressing circuit according to one aspect of the present invention.

According to one aspect of the probe circuit of the present invention is to provide a means of observing and controlling all flip-flops in the FPGA fabric. This serves several purposes. It reduces the number of test designs required for functional and delay testing of FPGAs. In addition, it enables testing of a pre-programmed customer design for volume production without having to program other test designs. It also enables save/restore of system state information to/from non-volatile memory A preferred embodiment is to provide a read-only probe, and extend it to provide a write (controllability) capability as well using the same lines for addressing and data. This provides functionality equivalent to a scan chain, but also provides the desired debugging capability. It is thus very area efficient. An illustrative probe circuit 10 is shown in FIG. 1, to which attention is now drawn. Two independent probe channels, A and B, are provided. The signals for channel A are described. Persons of ordinary skill in the art will appreciate that the signals for channel B operate in the same manner. The flip-flops to be probed are assumed to be in groups of four, with the groups arranged in rows and columns. Persons of ordinary skill in the art will appreciate that the present invention can be configured for other group sizes.

Normal operation of the probe circuit 10 of FIG. 1 is as follows. A flip-flop 12 or 14 to be write probed is assumed to have an asynchronous load capability. The output of a flip flop 12 or 14, or other circuit node output Y from logic circuits 16 or 18 can be read by the probe circuitry according to the present invention.

The signal $al_0\_b$ on line 20 is an active-low asynchronous load signal coming from the programmable routing. The signal $al_0$ on line 22 through NAND gate 24 is an active-high asynchronous load signal going to the flip-flop, and in normal operation it is just the complement of $al_0\_b$. The signal $ad_0$ at the output of multiplexer 26 is the asynchronous data signal going to the flip-flop 12, and in normal operation it is specified by the configuration multiplexer 28 to be either 0 (async clear) or 1 (async set).

Reading works as follows. The signal on one of lines 30, 32, 34, or 36 is the output of the flip-flop or other signal Y on an internal circuit node that it is desired to read. For channel A, the signal rena on line 38 is the read-enable signal for a particular row. The signal rena_b at line 40 is the inverse of rena. For channel B, the signal renb on line 42 is the read-enable signal for a particular row. The signal renb_b at line 44 is the inverse of renb. The line prbda at reference numeral 46 is a data line for a column in channel A and the line prbdb at reference numeral 48 is a data line for the column in channel B. Access to lines rena 38, rena_b 40, renb 42, renb_b 44 from on chip is provided by a row decoder. Access to lines prbda 46 and prbdb 48 from on chip is provided by a column decoder.

The lines prbra<3:0> collectively identified by reference numeral 50 are the address lines to select one of four flip-flops in a group for channel A. Likewise, the lines prbrb<3:0> collectively identified by reference numeral 52 are the address lines to select one of four flip-flops in a group for channel B. Access to lines prbra<3:0> 50 and prbrb<3:0> 52 from on chip is provided by a row decoder.

All of the control signals shown on left side in FIG. 1 are from an on-chip row decoder. The vertical lines prbda 46 and prbdb 48 are from and to a column decoder block. The row and column access is very similar to known memory array structures like SRAM. In this sense, the addressing of the present invention operates like an embedded memory with on-chip interface including address, control signals and write/read data.

In one exemplary embodiment of the invention illustrated in FIG. 1, the row and column decoder access may be accomplished through an on-chip microcontroller 90 driving row decoder 92 and column decoder 94, as is known in the art. Such a configuration allows both read and write access the probe flip flops with an on-chip firmware program that is easily created by persons of ordinary skill in the art in light of the present disclosure. For example, the microcontroller can be programmed to write data to all probe flip flops and then read and compare all the outputs of all flip flops, resulting in a BIST capability. Error data can be reported off chip by the microcontroller. In addition, the microcontroller can execute a routine to read and write the probes from outside the chip. The transmission of data onto and off of the chip by the microcontroller is shown by double arrow line 96. In addition, the probe circuitry can be configured through FPGA programming/configuration and be used by the customer to permanently select one probe read address, routed to a chip output, thus providing real-time observation.

Depending on which prbra<3:0> line is active, one of NAND gates 54, 56, 58, and 60 gate the flip-flop or Y signal from one of lines 30, 32, 34, or 36 into NAND gate 62. By raising rena 38 and one of the four prbra<3:0> lines 50 and lowering rena_b 40, the selected flip-flop or Y output is sent to the tristate driver 64 coupled to the output of NAND gate 62 and onto the column data line prbda 46. Had channel B been selected, depending on which prbrb<3:0> is active, one of NAND gates 66, 68, 70, and 72 gate the flip-flop signal from one of lines 30, 32, 34, or 36 into NAND gate 74. By raising renb 42 and one of the prbrb<3:0> lines at reference numeral 52 and lowering renb_b at reference numeral 44, the selected flip-flop or Y output is sent to the tristate driver 76 coupled to the output of NAND gate 74 and onto the column data line prbdb 48.

For writing, the usual async load and data signals going to the flip-flop are intercepted. The signal wen at reference numeral 78 is the write-enable signal for a particular row. Access to the signal wen from on chip is provided by a row decoder as previously mentioned. The signal prbdb 48 is used as column select during write. When wen 78 and prbdb 48 are high, and the one of prbra<3:0> lines 50 coupled to NAND gate 80 is active (the line decoding flip flop 12 is shown in FIG. 1), the output of NAND gate 80 becomes low. The $al_0$ signal 22 through NAND gate 24 becomes high and the $ad_0$ signal 26 is sourced to flip flop 12 from the logic level on prbda line 46 through multiplexer 26 instead of the zero or one logic levels otherwise supplied by multiplexer 28.

The operation of NAND gates 82 and 84 and multiplexers 86 and 88 associated with channel B is the same as described for channel A. The prbda 46 line is used for writing the data, while prbdb 48 line to an input of NAND gate 82 is used as column address select. For selecting a probe, wen 78 line is the row selector, prbdb line 48 is the column select and one of prbrb<3:0> lines 52 is used to select a single probe in selected row and column. The $al_1\_b$, $al_1$, and $ad_1$ signals are similar to those described with reference to channel A.

Persons of ordinary skill in the art will observe that the circuit shown in FIG. 1 permits simultaneous reading of both the A and B channels and also permits simultaneous writing of both the A and B channels so long as the same data value is to be written into the flip flops.

Figure 2:
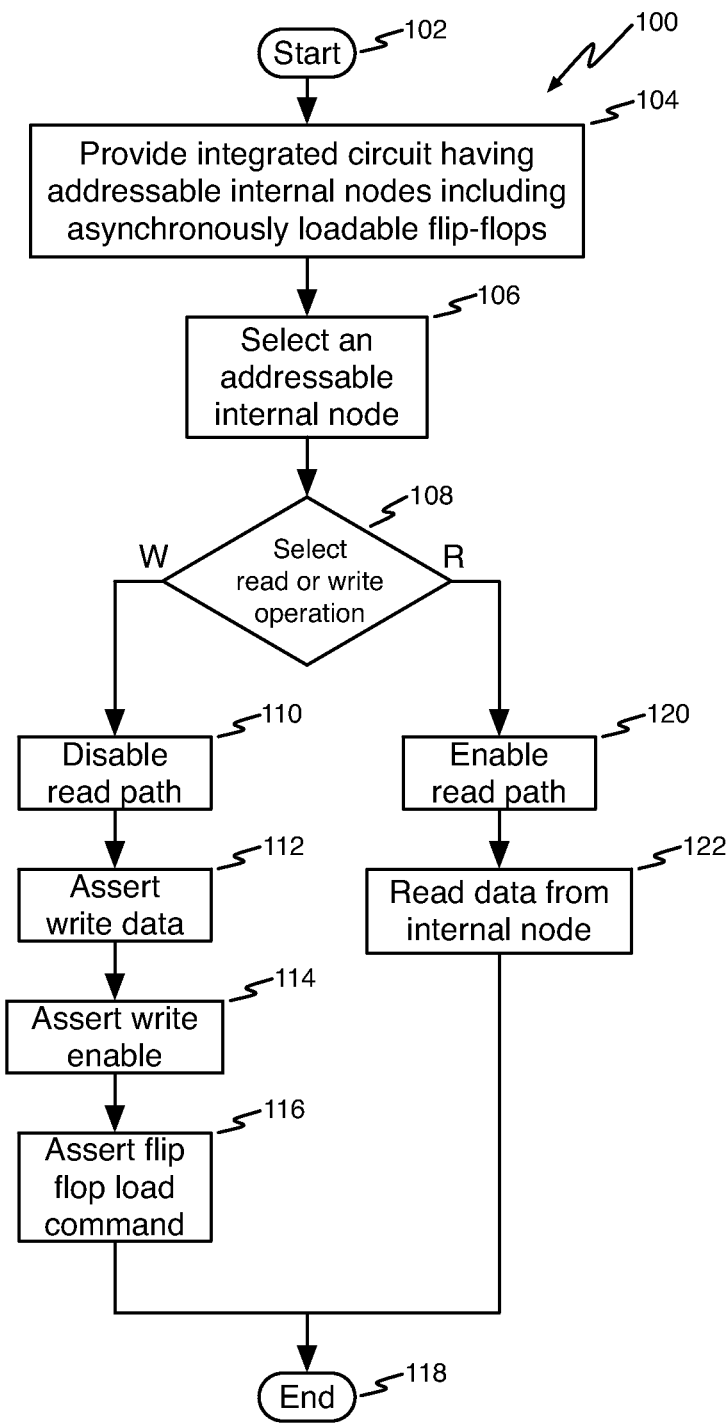
FIG. 2 is a flow diagram showing an illustrative method for performing read and write probing of an integrated circuit according to another aspect of the present invention.

Referring now to FIG. 2, a flow diagram shows an illustrative method 100 for performing read and write probing of an integrated circuit according to another aspect of the present invention. The method, performed in one embodiment by microcontroller 90, starts at reference numeral 102.

At reference numeral 104 an integrated circuit having addressable internal nodes including asynchronously loadable flips flops is provided. At reference numeral 106 an addressable internal node is selected. In the embodiment shown in FIG. 1, this is done by selecting one of the prbra or prbrb lines from the groups of lines 50 and 52.

At reference numeral 108 a read or write probe operation is selected. If a write probe operation has been selected, the off-chip read path is disabled at reference numeral 110. In the embodiment shown in FIG. 1, enable lines rena and rena_b (or renb and renb_b) are used to place tristate buffer 64 or 76 into a high-impedance state to disconnect them from the prda and prdb lines 46 and 48. In the embodiment shown in FIG. 1, the selection of read or write probe operation and disabling of the read path may be performed by asserting the appropriate logic levels on enable lines rena and rena_b (or renb and renb_b).

At reference numeral 112, write data is asserted. In the embodiment shown in FIG. 1, this is done by placing the write data on the prbda line 46. At reference numeral 114, a write enable signal is asserted. In the embodiment shown in FIG. 1, this is done by asserting the wen line 78. After the data and the write enable have been asserted, at reference numeral 116 the asynchronous load input to the selected flip flop is asserted to write the data into the selected flip flop. Persons of ordinary skill in the art will appreciate that the order of performing the processes at reference numerals 112 and 114 is not critical. The process ends at reference numeral 118.

If a read probe operation has been selected, the read path is enabled at reference numeral 120. In the embodiment shown in FIG. 1, the selection of read or write probe operation and enabling of the read path may be performed by asserting the appropriate logic levels on enable lines rena and rena_b (or renb and renb_b) to enable buffer 64 or 76. At reference numeral 122, the data is read from the selected internal node. The process then ends at reference numeral 118. Persons of ordinary skill in the art will appreciate that the process remains at reference numeral 122 where the present invention is employed to provide real-time observation of a selected flip-flop output or other test point" as described herein.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated programmable logic circuit comprising:
a plurality of programmable logic circuits having internal circuit nodes;
a plurality of flip flops, each flip flop having an asynchronous data input line, an asynchronous load line, and a data output connected to an internal circuit node;
a probe-data line;
an address circuit coupled to address lines for selecting one of the internal circuit nodes;
a read-probe enable line for selectively coupling the selected one of the internal circuit nodes to the probe-data line;
a data input path to the asynchronous data input line of each flip flop;
a write-probe data input path to the asynchronous data input line of each flip flop;
a write-probe enable line; and
selection circuitry, responsive to the address circuit and the write-probe enable line, selectively coupling one of the data input path and the write-probe data input path to the asynchronous data input of a selected flip flop.

2. The integrated circuit of claim 1, further including a tri-state buffer coupled between the output of the selected internal circuit node and the data probe line, an enable input of the tri-state buffer coupled to the read-probe enable line.

3. The integrated circuit of claim 2 wherein the enable input of the tri-state buffer comprises a pair of complementary enable input; and
the read-probe enable line comprises a pair of complementary enable lines.

4. The integrated circuit of claim 1 wherein the address circuit comprises logic gates coupled between the internal circuit nodes, the address lines and the tri-state buffer.

5. The integrated circuit of claim 1 wherein the address lines, the write probe enable line and the read probe enable line are driven by a microcontroller through a row decoder.

6. The integrated circuit of claim 1 wherein the write-probe data input path is driven by a microcontroller through a column decoder.

7. In an integrated circuit including programmable logic circuitry including a plurality of flip flops arranged in a plurality of rows and columns, each flip flop having an asynchronous data input line, an asynchronous load line, and a data output, a read-write probe circuit for the flip flops comprising:
a probe data line;
a probe-data/column-select line;

a first address circuit coupled to first address lines for choosing a selected flip flop from a first group of the plurality of flip flops;

a first read-probe enable line for selectively coupling the data output of the selected flip flop from the first group to the probe-data line;

a second address circuit coupled to second address lines for choosing a selected flip flop from a second group of the plurality of flip flops;

a second read-probe enable line for selectively coupling the data output of the selected flip flop from the second group to the probe-data/column-select line;

a data input path to the asynchronous data input line of each flip flop;

a write-probe data input path from the probe data line to the asynchronous data input line of each flip flop;

a write-probe enable line;

first selection circuitry coupled to the probe-data/column-select line, the write-probe enable line and the first address circuit, to selectively couple one of the data input path and the write-probe data input path to the asynchronous data input of the selected flip flop from the first group; and second selection circuitry coupled to the probe-data/column-select line, the write-probe enable line and the second address circuit, to selectively couple one of the data input path and the write-probe data input path to the asynchronous data input of the selected flip flop from the second group.

8. The integrated circuit of claim 7, further including:
a first tri-state buffer coupled between the output of the selected flip flop from the first group and the data probe line, an enable input of the first tri-state buffer coupled to the first read-probe enable line; and a second tri-state buffer coupled between the output of the selected flip flop from the second group and the data probe line, an enable input of the second tri-state buffer coupled to the second read-probe enable line.

9. The integrated circuit of claim 7 wherein:
the enable input of the first and second tri-state buffers comprises a pair of complementary enable inputs; and
the first and second read-probe enable lines each comprise a pair of complementary enable lines.

10. The integrated circuit of claim 7 wherein:
the first address circuit comprises logic gates coupled between the data outputs of the flip flops, the first address lines and the first tri-state buffer; and
the second address circuit comprises logic gates coupled between the data outputs of the flip flops, the second address lines and the second tri-state buffer.

11. The integrated circuit of claim 7 wherein the first and second address lines, the write probe enable line, and the read probe enable line are driven by a microcontroller through a row decoder.

12. The integrated circuit of claim 7 wherein the write-probe data input path and the probe-data/column-select line are driven by a microcontroller through a column decoder.

13. A method for probing a sequential logic device in a programmable logic device, comprising:
directly addressing a sequential logic device in the programmable logic device;
providing test input data directly to a data input of the sequential logic device;
enabling a write input to the sequential logic device; and
providing a write command to the sequential logic device to load the test input data into the sequential logic device.

14. The method of claim 13, further including:
directly addressing an internal node of the programmable device; and
sensing a logic value on the internal node.

15. The method of claim 14, wherein directly addressing an internal node of the programmable device comprises directly addressing an output of a sequential logic device.

16. The method of claim 15 wherein directly addressing an output of a sequential logic device comprises directly addressing the output of the sequential logic device to which test input data was provided.

17. The method of claim 15 wherein directly addressing a sequential logic device in the programmable logic device, providing test input data directly to a data input of the sequential logic device, enabling a write input to the sequential logic device, and providing a write command to the sequential logic device to load the test input data into the sequential logic device are performed by a microcontroller internal to the programmable logic device.

18. The method of claim 17 wherein directly addressing a plurality of flip flops in the programmable logic device, providing test input data having a selected logic level directly to a data input of each of the plurality of flip flops, enabling a write input to each of the plurality of flip flops, providing a write command to each of the plurality of flip flops to load the test input data into each of the plurality of flip flops, reading output data at outputs of each of the plurality of flip flops, and comparing the test input data and output data of each of the plurality of flip flops are performed by a microcontroller internal to the programmable logic device.

19. A method for probing flip-flops in a programmable logic device, comprising:
directly addressing a plurality of flip flops in the programmable logic device;
providing test input data directly to a data input of each of the plurality of flip flops;
enabling a write input to each of the plurality of flip flops;
providing a write command to each of the plurality of flip flops to load the test input data into each of the plurality of flip flops;
reading output data at outputs of each of the plurality of flip flops; and
comparing the test input data and output data of each of the plurality of flip flops.

* * * * *